United States Patent [19]
Pathak et al.

[11] Patent Number: 5,917,754
[45] Date of Patent: Jun. 29, 1999

[54] SEMICONDUCTOR MEMORY HAVING A CURRENT BALANCING CIRCUIT

[75] Inventors: Saroj Pathak; Jagdish Pathak, both of Los Altos Hills, Calif.

[73] Assignee: Atmel Corporation, San Jose, Calif.

[21] Appl. No.: 08/859,885

[22] Filed: May 21, 1997

[51] Int. Cl.$^6$ ............................................. G11C 16/06
[52] U.S. Cl. ................................. 365/185.21; 365/210
[58] Field of Search ..................... 365/185.21, 185.23, 365/210

[56] References Cited

U.S. PATENT DOCUMENTS

| | | | |
|---|---|---|---|
| 4,223,394 | 9/1980 | Pathak et al. | 365/210 |
| 5,025,417 | 6/1991 | Miyamoto et al. | 365/185.23 |
| 5,053,998 | 10/1991 | Kannan et al. | 365/194 |
| 5,113,372 | 5/1992 | Johnson | 365/205 |
| 5,197,028 | 3/1993 | Nakai | 365/185.21 |
| 5,301,149 | 4/1994 | Jinbo | 365/185.21 |
| 5,410,506 | 4/1995 | Ferrent et al. | 365/189.06 |

*Primary Examiner*—David Nelms
*Assistant Examiner*—Hoai V. Ho
*Attorney, Agent, or Firm*—Thomas Schneck; George B. F. Yee

[57] ABSTRACT

A memory device includes a memory cell whose data state is sensed by a sense amplifier. A balance amplifier having the same construction as the sense amplifier is utilized to sense a balance cell having the same construction as the memory cell. The balance cell is maintained in an erased (conductive) state. The balance cell is gated by the output of the sense amplifier. Such a device operates in a way to consume the same amount of power regardless of the data state of the memory cell. In one embodiment of the invention, a memory device consisting of a memory array includes a balance circuit associated with each of the sense amplifiers in the memory device. In another embodiment of the invention, a trim circuit is used to adjust the conductivity of the of the balance circuit. This allows the balance circuit to be fine tuned during manufacture to compensate for process variations, thus allowing the balance circuit to be matched to the memory cells.

18 Claims, 4 Drawing Sheets

SEMICONDUCTOR MEMORY HAVING A CURRENT BALANCING CIRCUIT

TECHNICAL FIELD

The present invention relates generally to semiconductor memories and more specifically to sense amplifiers used in such memories, the sense amplifiers having security features incorporated therein.

BACKGROUND ART

Smart cards (also known as IC cards) are wallet-sized plastic cards that resemble a credit card in appearance, but incorporate embedded microchips capable of storing significantly more information than the familiar magnetic stripe. Because of the increased data storage capacity, smart cards provide a host of new possibilities for information storage and transmission not available through other technologies, and thus are becoming a significant part of the information processing world.

The portability of smart cards makes it possible for individuals to carry large amounts of important data, such as their entire medical history, in their wallet. Other applications of smart cards include their use in financial transactions; for example, smart cards are being used in France and Germany in public payphones. In Singapore, the smart card is being introduced as a replacement for coins and banknotes for everyday purchases.

The seemingly limitless possible uses for smart cards raises the very real concern of secure access to the information stored in such cards, especially in those instances where personal information such as social security numbers and sensitive financial information are stored. Typical smart cards will allow access to information if they are given the correct password. The most common form of password is the PIN (personal identification number), typically a six to eight digit number entered via a numeric keypad. In theory, the card cannot be accessed unless the correct PIN is entered, so that if the card is lost or stolen an unauthorized user will not have access to the information.

The International Standards Organization (ISO) has produced the ISO 7816 standard, which defines the electrical contacts used in smart cards and which is likely to be the standard that will be adopted by the smart card industry. FIG. 6 shows that an ISO 7816 smart card includes electrical contacts which provide access to the IC's formed within the smart card. The C1 terminal provides power ($V_{cc}$) to the internal IC's. The C3 terminal is the input for an externally provided clock signal (CLK). Data is read and written through the C7 terminal. The ISO 7816 standard, therefore, defines how information is accessed and stored on the card. The standard, however, does not address smart card security.

The microchip(s) contained in a smart card typically employ $E^2$PROMs to store data. For example, the 24C0xSC series chips produced by Microchip Technology, Inc. include 1 K-bit or 2 K-bit $E^2$PROM arrays for data storage. Great care must be taken in the design of these non-volatile memories to insure against accidental corruption of the sensitive data stored therein. Equally important is the security of the data against unauthorized access to such data, which the 24C0xSC chips do not address.

Some integrated circuit vendors of smart card microchips incorporate security logic in their designs for this very purpose. For example Atmel Corp., assignee of the present invention, manufactures a smart card IC, the AT88SC10x, which features security code access to its data. The device permanently disables access upon a certain number of failed attempts to enter a valid code. Other chips, such as the SLE4436 M1 made by Siemens Corp., provide additional authentication through the storage of public keys. It has been observed, however, that the contents of a smart card data store can be detected despite such security features.

FIG. 7 shows a typical memory cell, such as $E^2$PROM or flash memory, consisting of a memory cell floating gate transistor 10, which is selected by a word select line. A sense amplifier 20 is coupled to the memory cell through a bit sense transistor 12 that is gated by a bit select line, for reading the memory cell. Typically, the sense amp 20 is driven by one of a number of memory cells. A dummy cell 14 and its associated circuitry 40 serves as compensation circuitry to account for differences among the memory cells due to process variations.

Operation of the memory cell 10 is well known. Briefly, a logic "0" or a logic "1" is represented respectively by not storing (erased) or storing (non-erased) a charge in the floating gate of the transistor 10. A stored charge on the floating gate raises the gate threshold voltage so that when the cell is selected (by asserting the word select line) the transistor will remain non-conductive by virtue of the increased gate threshold. Conversely, an erased cell is absent any such charge so that selecting the cell will cause the transistor to conduct.

The sense amplifier 20 includes a biasing circuit 22 consisting of transistors 31, 33, and 35. A current drive circuit 24 consists of a transistor 30 and a feedback circuit 32, 34. The output of the sense amplifier is provided at DATAOUT.

When the memory cell 10 is erased and is selected, the memory cell becomes conductive which will tend to bring the node 21 to ground. As a result, transistor 30 turns on strongly (via transistor 31) and transistor 32 is turned on through the feedback circuit 32, 34. A current path is created through transistors 30, 32, 12, and 10 to ground, thus bringing the node 23 to ground resulting in a low DATAOUT.

When the memory cell 10 is non-erased and is selected, the cell will not conduct. The feedback circuit 32, 34 maintains node 21 at a potential sufficient to turn on transistor 31 slightly. This begins to turn on transistor 30 so that node 23 approaches $V_{cc}$ resulting in a high DATAOUT.

As can be seen from the above explanation of FIG. 7 when the memory cell 10 is in an erased state, sensing of the memory cell will result in the flow of current through transistors 30, 32 of the sense amplifier 20 and through the transistor 10 to ground. Conversely when the memory cell is in a non-erased state, the cell is non-conductive when selected and so there will be no current flow through the transistors 30, 32. The power consumption of the sense amplifier 20, therefore, varies depending on the data content of the memory cell 10 during sensing of the memory cell. Thus, it is possible to ascertain the pattern of ones and zeroes comprising the data stored in the memory array, simply by clocking through the array while monitoring the current draw of the power supply and correlating the clock with measurements taken of the supply current.

Referring again to FIG. 6, it can be seen that smart cards are susceptible precisely to this type of attack on the security of the data stored therein. The security of smart cards can be breached by monitoring and recording changes in the current supplied to the $V_{cc}$ terminal (C1 in the case of ISO 7816 cards) while supplying a clock signal to the CLK terminal C3. The resulting supply current waveforms correspond directly to the data stored in the smart card, thus allowing a person to bypass any security measures built into the smart card and "read" the secured data.

What is needed is a memory device which can provide additional security beyond presently available methods for securing smart cards, thus rendering such cards impervious to attack by unauthorized persons. It is desirous to have a memory circuit which is safeguarded against unauthorized access by monitoring supply current, and therefore is highly secure.

SUMMARY OF THE INVENTION

In accordance with the present invention, a memory device includes a memory circuit having a memory cell and a sense amplifier for sensing data contained in the memory cell. The memory device further includes a current offset circuit (balance circuit) coupled to the output of the sense amplifier. The offset circuit operates in response to the sensed data of the memory cell to increase or decrease its power consumption in such a way as to offset variations in the power consumed by the memory circuit. In particular, a first current flows through the memory circuit when sensing a logic "1" stored in the memory cell, and a second current flows when sensing a logic "0" stored in the memory cell. The offset circuit operates in inverse relation to the memory circuit, drawing a current substantially equal to the second current flow when a logic "1" is sensed and drawing a current substantially equal to the first current flow when a logic "0" is sensed. In this manner, the total supply current drawn by the memory device remains substantially constant, thus rendering it impossible to discern whether a "1" or a "0" is being sensed by monitoring the supply current.

In another embodiment of the invention, the offset circuit includes a trim circuit for adjusting the current draw of the offset circuit. This allows the current of the offset circuit to be fine tuned to account for differences among the transistor elements due to process variations.

In yet another embodiment of the present invention, a memory array includes a plurality of memory cells arranged in a grid of rows and columns. Each row of memory cells has an associated word select line. Each column of memory cells has a corresponding sense amplifier. Associated with each sense amp is a current offset circuit which operates in inverse relation to the sense amplifier so that the supply current drawn by the memory device is substantially independent of the sensing of the data stored in the memory cells.

BEST MODE OF CARRYING OUT THE INVENTION

Figure 1:
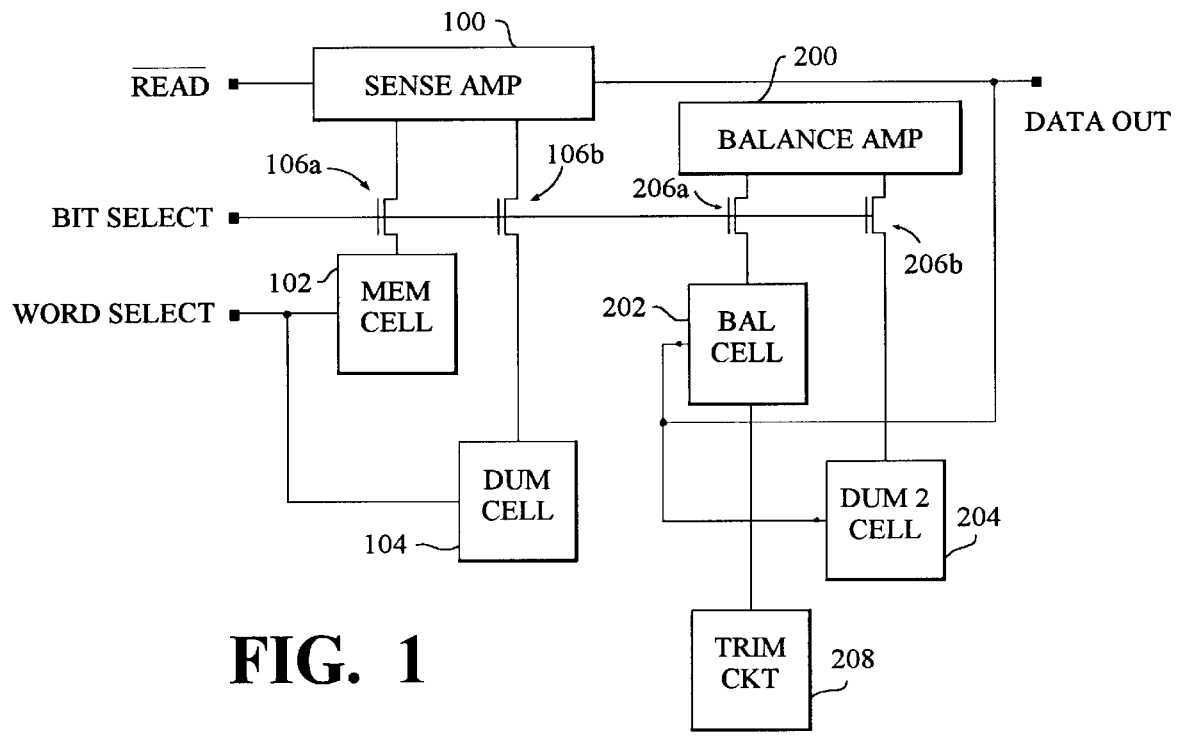
FIG. 1 is a generalized block diagram of the memory device of the present invention.

Referring to FIG. 1, a memory device in accordance with the present invention includes a sense amp 100 for sensing the data stored in a memory cell 102. The memory cell is gated to the sense amp 100 by asserting a bit select line, which turns on a bit select transistor 106a, and by asserting a word select line. A dummy cell 104 is coupled via a bit select transistor 106b to the sense amp to compensate for process variations among the plurality of memory cells sensed by the sense amp. The memory device includes a balance circuit which consists of a balance cell coupled to a balance amp 200 through a bit select transistor 206a. A dummy cell 204 is also coupled to the balance amp 200 via a bit select transistor 206b. The bit select transistors 106a, 106b, 206a, and 206b are driven by the same bit select line. The output of the sense amp 100 is coupled to the word select of a balance cell 202.

It is noted that numerous designs for single-ended serial memory devices such as $E^2PROM$ and flash memory exist. The present invention has the advantage that any one of such devices can be used. Therefore, as many embodiments of the present invention exist as there are single-ended memory circuit designs. Thus, the following discussion will be made with respect to the circuitry shown in FIG. 7. However, it is understood that the circuit is exemplary only and that the invention is readily adaptable to any memory design.

Figure 2:
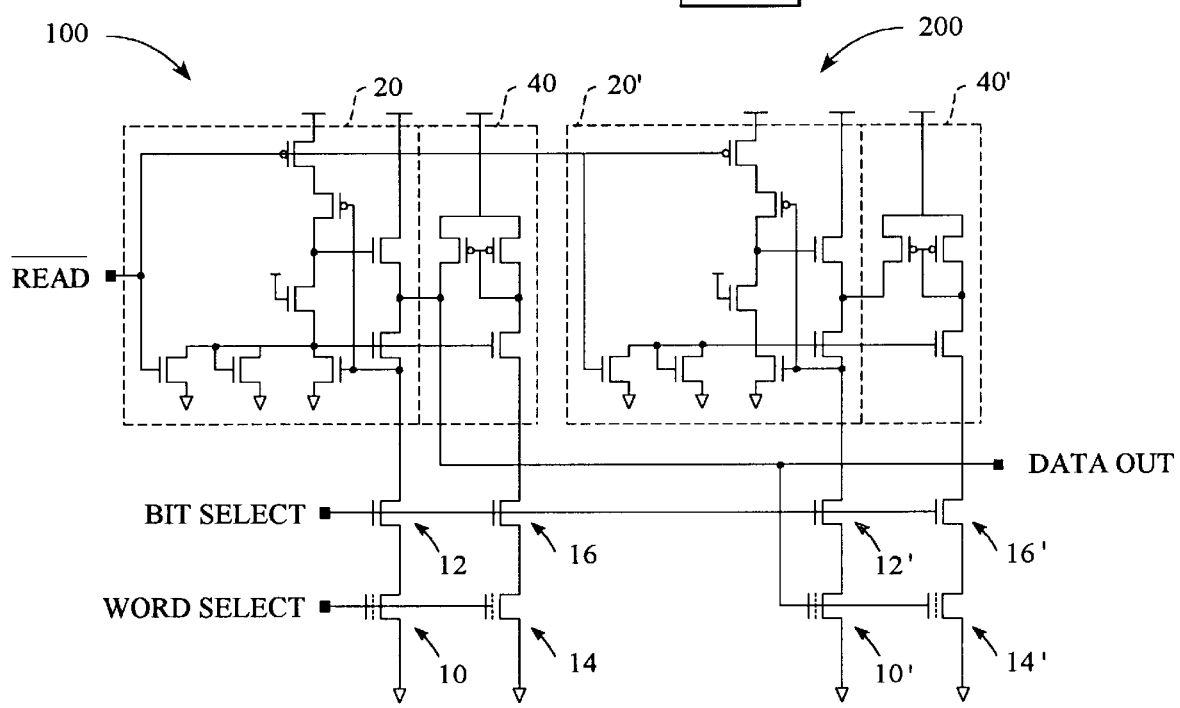
FIG. 2 shows a specific memory circuit in accordance with the present invention.
Figure 7:
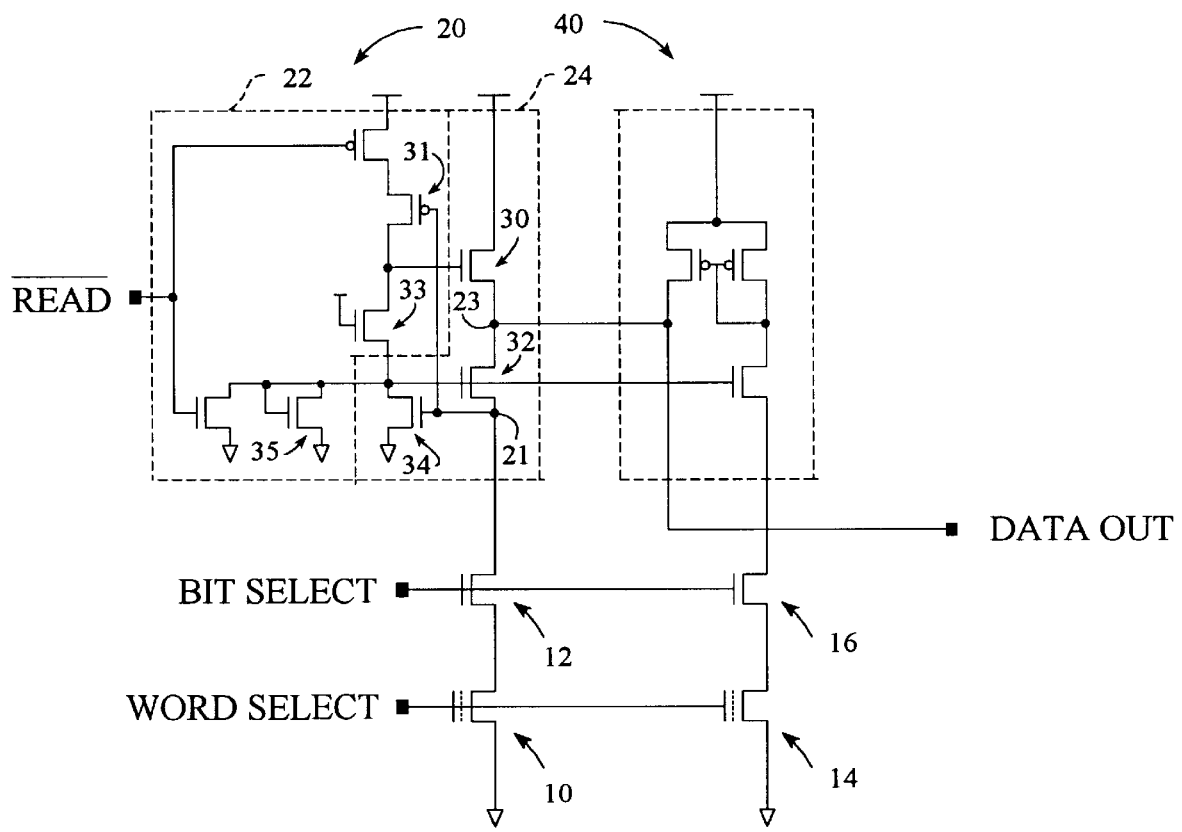
FIG. 7 shows a typical prior art memory cell.

FIG. 2 shows a specific embodiment of the invention outlined in FIG. 1, using the circuitry disclosed in FIG. 7. As can be seen, in FIG. 2, the balance circuitry is a duplication of the circuitry which comprises the memory device. The elements which comprise the balance circuitry is shown by the primed reference numerals, for example balance cell 10' and balance amp 20', 40'. The word select line is coupled to the memory cell 10 and the dummy cell 14. The balance cell 10' and the dummy cell 14' are coupled to the output of the sense amp 20. In addition, the balance cell 10' is pre-programmed to be in an erased state.

Operation of the circuit of FIG. 2 will now be described. Consider first, the situation where the sense amp 20 is reading a conducting memory cell; i.e. the floating gate transistor 10 is in an erased state (usually identified as logic "0"). Since the transistor is erased, it is turned on when selected thus sinking current. This drives the sense amp output DATAOUT to ground. Since DATAOUT is low, the balance cell 10' remains turned off and thus non-conducting. The source current $I_{zero}$ for the device in this situation is:

$$I_{zero} = I_{sense\ zero} + I_{balance\ quiescent} + I_{memory\ cell}$$

where $I_{sense\ zero}$ is the current draw of the sense circuitry 20 and 40 when sensing a conducting memory cell 10, $I_{balance\ quiescent}$ is the current draw of the balance circuitry 20' and 40' when sensing a non-conducting balance cell 10', and $I_{memory\ cell}$ is the current drawn by a conducting memory cell 10.

Consider next the situation where the sense amp 20 is reading a non-conducting memory cell; i.e. the floating gate transistor 10 is in a non-erased state (usually identified as logic "1"). In this state, the transistor's gate threshold is elevated and thus remains non-conducting when selected. This causes the sense amp output DATAOUT to go high. Recalling that balance cell 10' is in the erased state, DATAOUT being high turns on the balance cell, making it conductive. The total current consumption Iorte in this situation is:

$$I_{one} = I_{sense\ quiescent} + I_{balance\ zero} + I_{balance\ cell}$$

where $I_{sense\ quiescent}$ is the current draw of the sense circuitry 10–16, 20, and 40 when sensing a non-conducting memory cell 10, $I_{balance\ zero}$ is the current draw of the balance circuitry 10'–16', 20', and 40' when sensing a conducting balance cell 10', and $I_{balance\ cell}$ is the current drawn by a conducting balance cell 10'.

Since the memory circuitry 10–40 is identical to the balance circuitry 10'–40', the following are true:

$$I_{sense\ zero} = I_{balance\ zero};$$

$$I_{sense\ quiescent} = I_{balance\ quiescent};\ \text{and}$$

$$I_{memory\ cell} = I_{balance\ cell}.$$

It follows, therefore, that $I_{zero}=I_{one}$. That is, the supply current consumed by the memory device of the present invention is independent of the data stored in the memory cell 10. In addition, as noted above and with reference to the generic schematic of FIG. 1, the present invention is adaptable to work with any single-ended memory circuit design known in the art.

Figure 3:
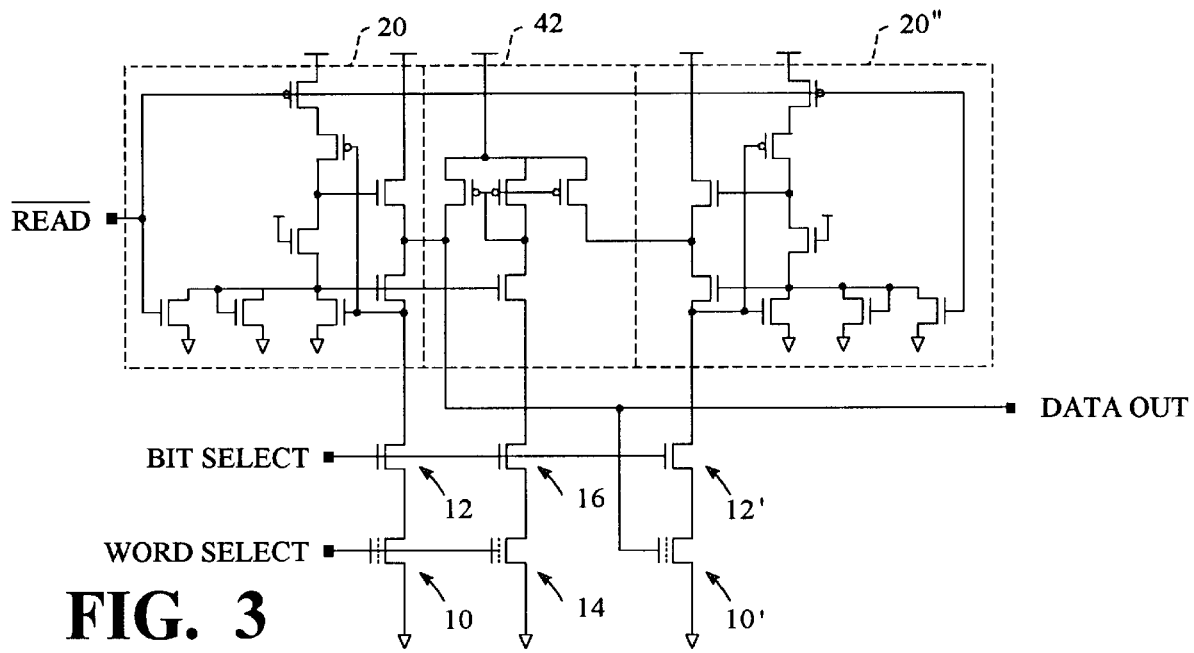
FIG. 3 shows an alternate embodiment of the memory circuit shown in FIG. 2.

It is further noted that some memory designs may permit sharing of certain elements, such as the memory circuit of FIG. 7 for example, where the relationship $I_{zero}=I_{one}$ holds true. FIG. 3 shows an embodiment of such a memory device employing the circuit of FIG. 7. The transistors 30–35 of the sense amp 20 are duplicated as 30'–35' in the balance amp 20". The compensation circuitry 42 is shared between the two amplifiers. As in FIG. 2, the balance cell 10' is pre-programmed to be in the erased state, and is driven by the output DATAOUT of the sense amp.

In the situation where the sense amp 20 is reading a conducting memory cell (logic "0"), the current equation is:

$$I_{zero}=I_{sense\ zero}+I_{balance\ quiescent}+I_{memory\ cell}+I_c$$

where $I_{sense\ zero}$ is the current draw of the sense circuitry 20 when sensing a conducting memory cell 10, $I_{blame\ quiescent}$ is the current draw of the balance circuitry 20' when sensing a non-conducting balance cell 10', $I_{memory\ cell}$ is the current drawn by a conducting memory cell 10, and $I_c$ is the current drawn by the compensation circuit 42 and transistors 16 and 14, when the memory cell 10 is conducting and the balance cell 10' is non-conducting.

In the situation where the sense amp 20 is reading a non-conducting memory cell (logic "1"), the current equation is:

$$I_{one}=I_{sense\ quiescent}+I_{balance\ zero}+I_{balance\ cell}+I_{c'}$$

where $I_{sense\ quiescent}$ is the current draw of the sense circuitry 20 when sensing a non-conducting memory cell 10, $I_{balance\ zero}$ is the current draw of the balance circuitry 20' when sensing a conducting balance cell 10', $I_{balance\ cell}$ is the current drawn by a conducting balance cell 10', and $I_{c'}$ is the current drawn by the compensation circuit 42 and transistors 16 and 14, when the memory cell 10 is non-conducting and the balance cell 10' is conducting.

Since the memory sense amp 20 and the bit and word select transistors 12 and 10 are identical to the balance amp 20' and the bit and word select transistors 12' and 10', the following are true:

$$I_{sense\ zero} = I_{balance\ zero};$$

$$I_{sense\ quiescent} = I_{balance\ quiescent};$$

$$I_{memory\ cell} = I_{balance\ cell};\ \text{and}$$

$$I_C = I_{C'}$$

Thus, as with the embodiment of FIG. 2, the relation $I_{zero}=I_{one}$ holds true for the embodiment of FIG. 3.

Figure 4:
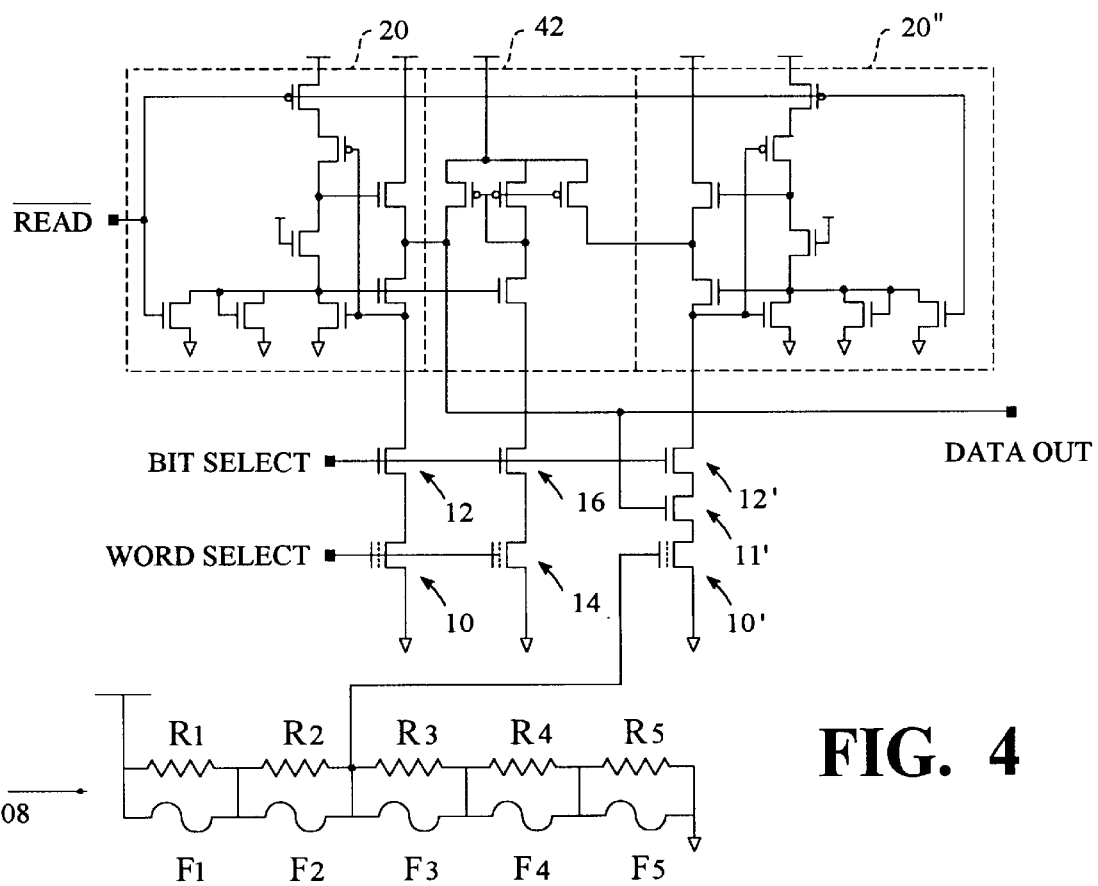
FIG. 4 depicts a trim circuit.

FIG. 4 shows a typical circuit implementation of the trim circuit 208 shown in FIG. 1. The trim circuit 208 is used to adjust the gate current of the balance cell 202 to provide current matching capability during testing and more generally to permit fine tuning to compensate for fabrication process variations. Referring to FIG. 4, an embodiment of a memory device of the present invention incorporating a trim circuit 208 is derived from the embodiment of FIG. 3. A memory cell 10 is coupled to sense amp 20. A balance cell 10' is coupled via select transistor 12' and pass transistor 11 to a balance amp 20". The balance cell 10' is coupled to trim circuit 208. The output of sense amp 20 drives the transistor 11.

The trim circuit 208 consists of a series connection of resistors $R_1$–$R_5$. A series of fusible links $F_1$–$F_5$ is coupled in parallel to the resistor chain. The resistor chain acts as a programmable voltage divider which drives the gate of balance cell 10'. The voltage divider is programmed simply by blowing one or more appropriate fuses. Thus by adjusting the voltage divider, the balance cell 10' can be partially turned on. This allows for the current draw of the balance cell to be fined tuned during manufacture to compensate for process variations. Although FIG. 4 shows a resistor chain to provide a variable voltage divider to pre-bias the balance cell 10', any of a number of similar circuits which provide a programmable voltage level can be used for the trim circuit and are deemed to be well within the scope of an artisan of ordinary skill.

Figure 5:
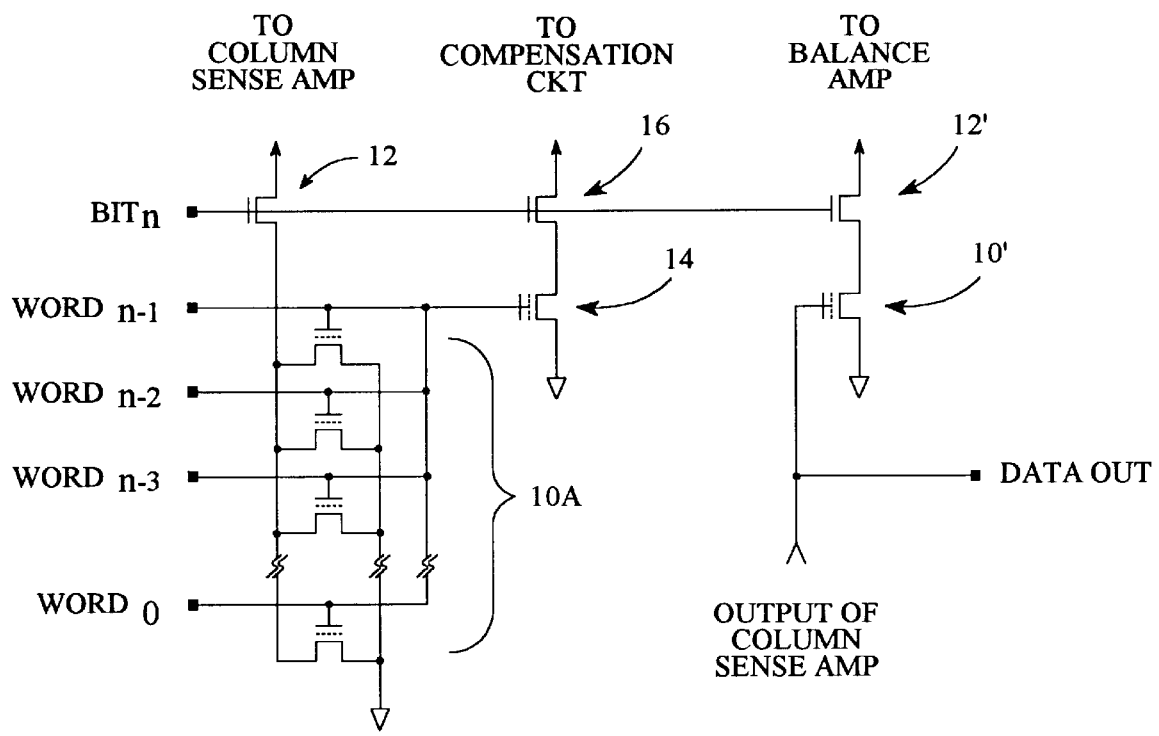
FIG. 5 shows a memory array in accordance with the present invention.
Figure 6:
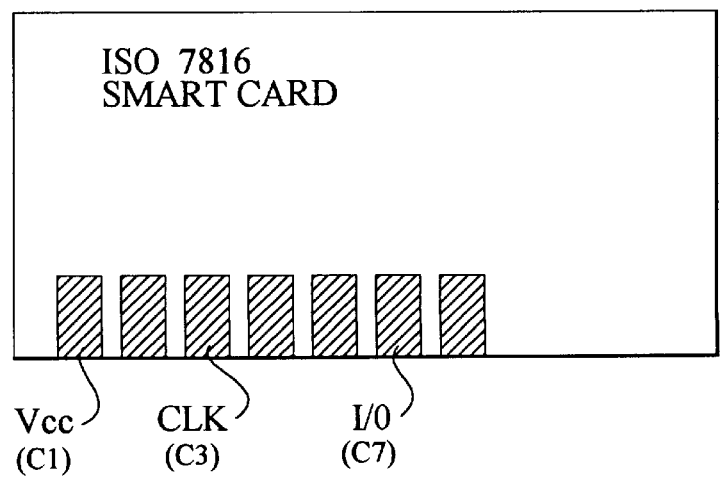
FIG. 6 illustrates a typical ISO 7816 smart card.

Turning now to FIG. 5, it can be seen that the present invention is readily adapted to a memory array. Whereas serial memory devices utilize one sense amplifier, a memory array utilizes more than one sense amplifier, one for each column of memory cells. FIG. 5 shows the present invention as applied to one column of memory cells 10A in such an array of memory cells. This is repeated for each column sense amp in the memory device.

A column is selected via the bit select line $BIT_n$, while the word select line selects the row $WORD_0 \ldots WORD_{n-1}$. When a specific memory cell in a column is selected, the selected cell is effectively isolated from the non-selected cells. For a given selected memory cell, the resulting circuit behaves in the same manner as described above in connection with FIGS. 1–3 and the foregoing current equations. Thus, by providing each sense amp with its corresponding balance circuitry, the total current drawn through the memory device will remain substantially constant, independent of the pattern of zeros and ones being read.

We claim:

1. A memory device comprising:
   first cell means for storing data;
   first sense means, coupled to said first cell means, for sensing data stored therein and for outputting a signal indicative of data stored therein; and
   a current offset circuit coupled to receive output from said first sense means, said current offset circuit effective for drawing a current in response to and in inverse relation to a current drawn by both said first sense means and said first cell means during sensing of data;

whereby the current drawn by said memory device during sensing of data is substantially independent of the data stored in said first cell means.

2. The memory device of claim 1 wherein said current offset circuit includes a second cell means for storing data and a second sense means, coupled to said second cell means, for sensing data stored therein; said second cell means having substantially the same construction as said first cell means; said second sense means having substantially the same construction as said first sense means; said second cell means having a word select line coupled to receive output from said first sense means, whereby said second cell means is sensed by said second sense means on the basis of data stored in said first cell means.

3. The memory device of claim 1 wherein:

said first cell means is a floating gate transistor having an erased data state and a non-erased data state;

said first sensing means is a sense amplifier having an output to produce a first voltage when sensing that said floating gate transistor is in an erased data state and to produce a second voltage greater than said first voltage when sensing that said floating gate transistor is in a non-erased data state;

said current offset circuit includes a balance transistor substantially identical to said floating gate transistor and a balance amplifier substantially identical to said sense amplifier, said balance amplifier coupled to sense a data state of said balance transistor;

said balance transistor having a gate, said gate having a threshold voltage greater than said first voltage and less than said second voltage;

said balance transistor being in an erased data state;

said gate of said balance transistor coupled to said output of said sense amplifier, whereby said balance transistor is selected when said floating gate transistor is in a non-erased data state.

4. The memory device of claim 3 further including means for partially programming said balance transistor to adjust the current flow through said balance transistor when selected.

5. The memory device of claim 1 wherein said first cell means is a single-ended memory device.

6. A semiconductor memory comprising:

a floating gate memory cell and a sense circuit coupled thereto for sensing data stored in said memory cell, said sense circuit having an output; and a floating gate balance cell and a balance circuit coupled thereto for sensing data stored in said balance cell, said balance circuit substantially identical to said sense circuit, said balance cell substantially identical to said memory cell;

said balance cell having a word line for data read-out, said word line coupled to said sense circuit output.

7. The semiconductor memory of claim 6 wherein said balance cell is in an erased state.

8. The semiconductor memory of claim 6 wherein said sense circuit outputs a voltage exceeding the threshold voltage of said balance cell when said memory cell is in a non-erased state.

9. The semiconductor memory of claim 8 further including means for adjusting the current flow through said balance cell when said balance cell is turned on by said sense circuit.

10. A semiconductor memory device comprising:

a memory cell for storing data, said memory cell having a word select line for the selection thereof and a bit sense line;

a sensing circuit having an input coupled to said bit sense line of said memory cell for sensing data stored in said memory cell, said sensing circuit further having an output representative of said sensed data;

a balance cell having substantially the same construction as said memory cell, said balance cell having a word select line for the selection thereof and a bit sense line; and a balance circuit having substantially the same construction as said sensing circuit, said balance circuit having an input coupled to said bit sense line of said balance cell for sensing data stored in said balance cell;

said output of said sensing circuit coupled to said word select line of said balance cell so that said balance cell is selected, and thus sensed by said balance circuit, dependent upon data stored in said memory cell and the sensing of said data;

said balance cell having data stored therein such that a current drawn by said memory cell and by said sensing circuit is inversely related to a current drawn by said balance cell and by said balance circuit;

whereby a supply current drawn by said semiconductor memory device is substantially independent of the data being sensed in said memory cell.

11. The semiconductor memory device of claim 10 further including a trim circuit for adjusting said current drawn by said balance cell, whereby compensation for differences in current flows among the elements of said semiconductor memory device due to process variations during the manufacture thereof can be made.

12. The semiconductor memory device of claim 10 wherein said memory cell and said balance cell are floating gate devices each having an erased state and a non-erased state and said balance cell is in an erased state.

13. The semiconductor memory device of claim 12 wherein said sensing circuit output is a voltage exceeding a gate threshold voltage of said balance cell only when said memory cell is in a non-erased state.

14. The semiconductor memory device of claim 13 further including a trim circuit for adjusting said current drawn by said balance cell, whereby compensation for differences in current flows among the elements of said semiconductor memory device due to process variations during the manufacture thereof can be made.

15. A memory device comprising:

a plurality of memory cells arranged in a grid of rows and columns, each of said memory cells programmable to be conductive or non-conductive when said memory cell is selected;

a sense amp associated with each column of memory cells, each said sense amp having an output indicative of the conductive state of a selected memory cell, said selected memory cell and said sense amp having a current flow of a first magnitude when said selected memory cell is in a conductive state, said selected memory cell and said sense amp having a current flow of a second magnitude when said selected memory cell is in a non-conductive state;

a balance circuit associated with each said sense amp, said balance circuit responsive to an output of said sense amp for producing a current flow substantially equal to said second magnitude when said selected memory cell is in a conductive state and for producing a current flow substantially equal to said first magnitude when said selected memory cell is in a non-conductive state.

16. The memory device of claim 15 wherein:

each said balance circuit includes a programmable balance memory cell substantially identical in construction to the construction of said plurality of memory cells, each said balance circuit further including a balance sense amp substantially identical in construction to an associated sense amp, said balance memory cell being coupled to said balance sense amp for sensing current flow through said balance memory cell;

said balance memory cell includes a word select line coupled to an output line of said associated sense amp; and said balance memory cell is in a conductive state.

17. The memory device of claim 15 wherein each of said memory cells is a first floating gate transistor having a gate for the selection thereof and a drain coupled to an associated sense amp, said balance circuit includes a second floating gate transistor and a balance sense amp substantially identical to said associated sense amp, said second floating gate transistor includes a drain coupled to said balance sense amp and a control gate coupled to said output of said associated sense amp, and said second floating gate transistor is in an erased state.

18. The memory device of claim 17 further including a trim circuit for partially programming said second floating gate transistor to vary the conductivity of said second floating gate transistor when selected.

* * * * *